United States Patent [19]
Malone

[11] 4,101,844
[45] Jul. 18, 1978

[54] OSCILLATOR APPARATUS ADAPTED TO LOCK ONTO A SINGLE PULSE OF RADIO FREQUENCY WAVES

[75] Inventor: Hugh Robert Malone, Phoenix, Ariz.

[73] Assignee: Motorola, Inc., Schaumburg, Ill.

[21] Appl. No.: 814,511

[22] Filed: Jul. 11, 1977

[51] Int. Cl.² .............................................. H03B 3/04
[52] U.S. Cl. ....................................... 331/10; 325/341;
325/419; 331/14; 331/17; 331/25
[58] Field of Search ....................... 331/10, 14, 17, 18,
331/25; 325/341, 419

[56] References Cited
U.S. PATENT DOCUMENTS

| | | | |
|---|---|---|---|
| 3,568,085 | 3/1971 | Pimenoff | 331/17 X |
| 3,573,649 | 4/1971 | West | 331/17 X |
| 3,882,412 | 5/1975 | Apple, Jr. | 331/17 X |

*Primary Examiner*—Siegfried H. Grimm
*Attorney, Agent, or Firm*—Eugene A. Parsons

[57] ABSTRACT

A variable oscillator controlled by a phase-locked loop to lock on to a received pulse of radio frequency waves, sample and hold circuitry sampling the control signal in the loop and storing the signal, and a timed switch disconnecting the oscillator from the loop and connecting it to the sample and hold circuit after a predetermined period of time so that the oscillator is locked on to the radio frequency after the single pulse ceases.

3 Claims, 2 Drawing Figures

OSCILLATOR APPARATUS ADAPTED TO LOCK ONTO A SINGLE PULSE OF RADIO FREQUENCY WAVES

BACKGROUND OF THE INVENTION

The present invention pertains to oscillator apparatus for use in transponders, repeaters and the like wherein a single pulse of radio frequency waves may be transmitted to the transponder, repeater, etc. for the activation thereof. Once activated the transponder, repeater, etc. retransmits one or more pulses at the same frequency. It is essential in this system that the oscillator apparatus remember the received radio frequency and retransmit at the same frequency.

In prior art devices, the received frequency at the transponder, repeater, etc. is remembered in a digital memory circuit or the like. Because of the complex storage device used in prior art systems, these prior art systems are large, complex and costly. Further, the length of time required for the oscillator to lock on to the incoming signal is generally relatively slow so that the pulse of radio frequency waves must be relatively long.

SUMMARY OF THE INVENTION

The present invention pertains to an oscillator apparatus adapted to lock on to a single pulse, or burst, of radio frequency waves and maintain the oscillator locked after the single pulse has ceased, said oscillator apparatus including a variable oscillator with switch means connecting the oscillator into a control loop, sample and hold means sampling the control signal in the loop after the oscillator is locked on to the radio frequency and switch means disconnecting the oscillator from the loop and connecting it to the sample and hold means after a predetermined period of time, generally shorter than the length of time of the single pulse. Because the sample and hold means samples the control signal, which is a relatively slowly varying signal, a simple sample-and-hold circuit can be utilized, rather than the surface accoustic wave devices or digital memory devices utilized in the prior art. This relatively simple circuitry greatly reduces the expense, complexity and size of the oscillator.

It is an object of the present invention to provide a new and improved oscillator adapted to lock on to a single pulse of radio frequency waves, which oscillator is relatively simple, small and inexpensive.

It is a further object of the present invention to provide an oscillator adapted to lock on to a single pulse of radio frequency waves which operates much faster than prior art devices.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the Figures.

DESCRIPTION OF THE PREFERRED EMBODIMENT

Figure 1:
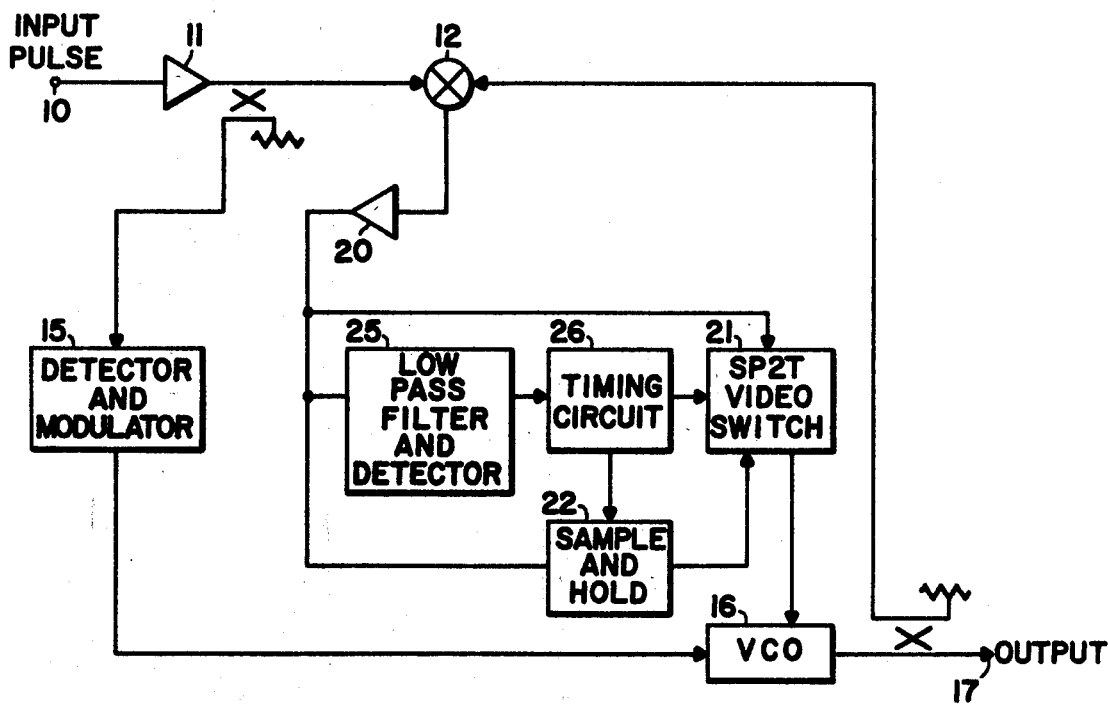
FIG. 1 is a block diagram of oscillator apparatus embodying the present invention.

Referring specifically to FIG. 1, an input terminal 10 adapted to receive a pulse, or burst, of radio frequency waves is connected to the input of an amplifier 11. The amplifier 11 is a soft limiting RF amplifier which is designed so that the output is always within 10 db. The output of the amplifier 11 is connected to one input of a phase detector 12. A portion of the output of amplifier 11 is also coupled to a detector and modulator circuit 15. The circuit 15 detects the input pulse and the leading edge thereof is connected to an input of a variable oscillator, which in this embodiment is a voltage controlled oscillator 16. The leading edge of the detected pulse is utilized to turn on the oscillator 16. The output of the oscillator 16 is applied to an output terminal 17. A portion of the output of the oscillator 16 is also coupled to a second input of the phase detector 12 where it is compared with the output of the amplifier 11 and an error signal is produced at the output thereof. The error signal from the phase detector 12 is connected to a loop amplifier 20, which in this embodiment is a relatively standard phase-locked loop wideband acquisition amplifier. The output of the amplifier 20 is connected directly to one terminal of a video switch 21 and through a sample-and-hold circuit 22 to a second terminal of the video switch 21. The output of the video switch 21 is connected to a control input of the oscillator 16.

The output of the amplifier 20 is also applied to a low-pass filter and detector circuit 25. The detected signal from the circuit 25 is applied to a timing circuit 26 to activate a timer. At some predetermined time after the timer is activated a signal is applied to the sample-and-hold circuit 22 to cause the circuit 22 to sample the error voltage at the output of the amplifier 20 and at a later predetermined time a signal is applied to the video switch 21 by the timing circuit 26 causing the video switch 21 to change modes.

In the operation of the oscillator apparatus, a pulse appearing at the input terminal 10 is amplified by amplifier 11, detected in circuit 15 and utilized to turn on the oscillator 16. The output of the oscillator 16 is coupled to the phase detector 12 which supplies an error voltage to control the oscillator 16 to lock on to the frequency of the input pulse. The total elapsed time from the incidence of the pulse to the oscillator lock up can be less than 100 nanoseconds. The error voltage at the output of the amplifier 20 is detected in the circuit 25 and activates the timing circuit 26. A predetermined time after the reception of the pulse at the terminal 10 the error, or oscillator control, voltage at the output of the amplifier 20 is sampled by the circuit 22. The length of the delay, or the predetermined time, should be greater than the total oscillator lock up time. The length of the sample interval can be less than 100 nanoseconds, after which time the switch 21 can be switched to the second mode and the hold circuit voltage is coupled to the oscillator 16. Simultaneously, the output of the amplifier 20 is removed from the oscillator 16. Because the control voltage in the hold circuit 22 is the same as the control voltage from the amplifier 20 with the oscillator locked on to the incident pulse, the oscillator frequency will be equal to that of the incident pulse and will remain equal until the hold voltage is removed. During the period that the hold voltage is applied, the oscillator 16 may be pulsed off and on and the frequency will remain constant.

Figure 2:
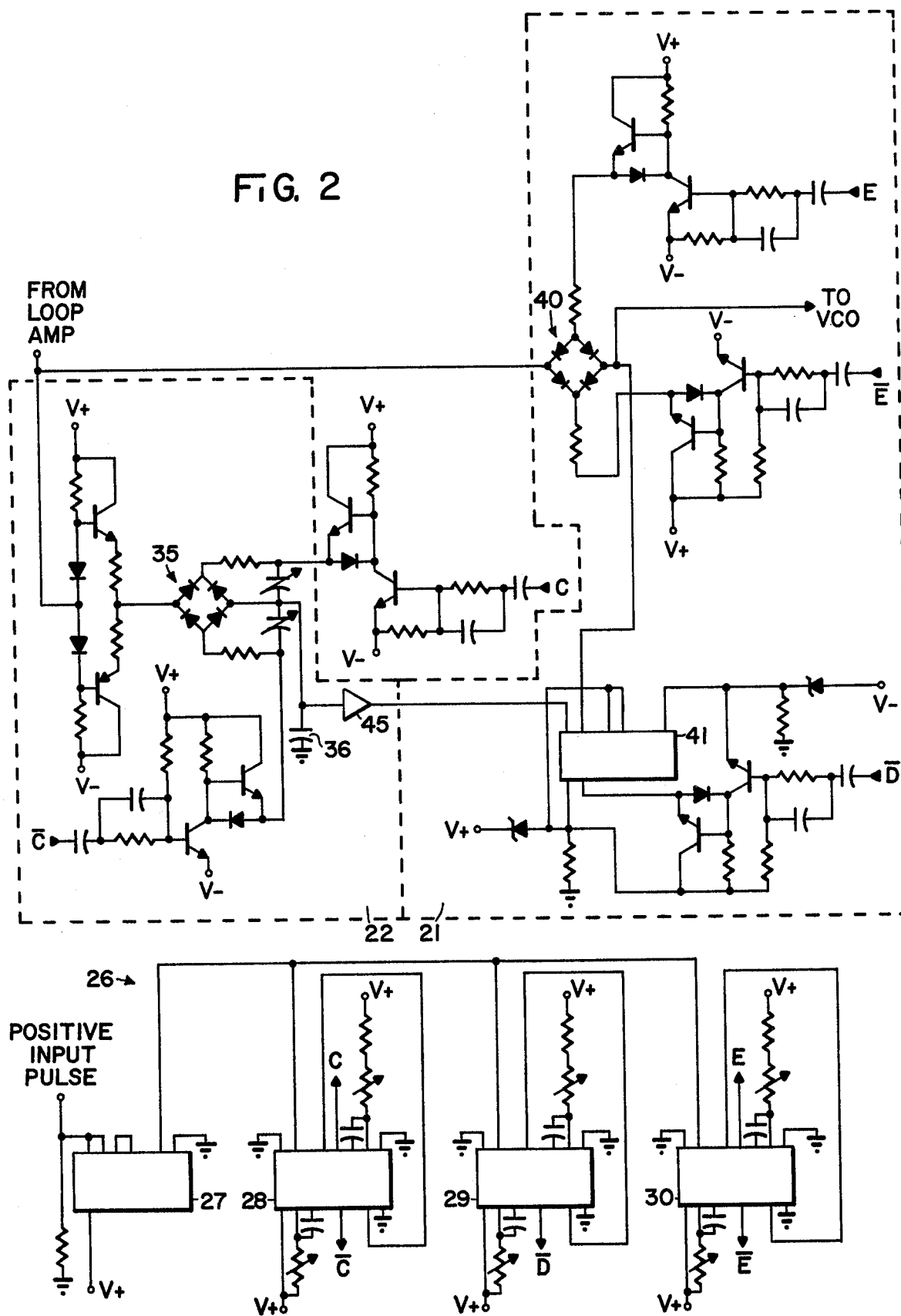
FIG. 2 is a schematic diagram of selected portions of FIG. 1.

Referring to FIG. 2, a specific sample-and-hold circuit 22, timing circuit 26 and video switch 21 are illustrated schematically for purposes of illustration. It should be understood that these specific circuits are illustrated only as examples and one skilled in the art may devise a variety of circuits which can provide the desired functions. The various connections from the timing circuit 26 to the sample-and-hold circuit 22 and the video switch 21 are represented by letter symbols to simplify the schematic. The timing circuit 26 is made up of four IC circuits, 27 through 30. The circuit 27 is simply an OR gate which is utilized as a buffer and will not be explained in detail. The output of the circuit 27 is coupled to the inputs of each of the IC circuits 28, 29, and 30 so that each circuit is activated simultaneously. The circuits 28, 29 and 30 each include a pair of one shot multivibrators connected in series in a standard timing circuit. The IC circuit 28 controls the sample-and-hold circuit 22, the circuit 29 controls one-half of the video switch 21 and the circuit 30 controls the other half of the switch 21, as will be described presently.

The sample-and-hold circuit 22 includes a diode bridge circuit 35 and biasing circuitry associated therewith for operating in conjunction with output pulses from the IC circuit 28 to cause the bridge 35 to operate as a switch. When the switch 35 is on a sample of the error voltage from the amplifier 20 is applied to a storage capacitor 36 and, before the input pulse at the terminal 10 disappears the IC circuit 28 opens the switch 35 in the sample-and-hold circuit 22 so that the voltage stored in the capacitor 36 is not degraded.

In this specific embodiment, the video switch 21 is made up of two parts, a loop switch and a hold switch. The loop switch includes a diode bridge 40 having biasing circuitry attached thereto similar to the circuitry utilized in the sample-and-hold circuit 22. The output of the IC circuit 30 is utilized in conjunction with the biasing circuitry to cause the bridge 40 to operate as a switch. When the bridge 40 is on, signals pass therethrough from the loop amplifier 20 to the oscillator 16. The hold switch includes an IC circuit 41 which is a switching circuit well known to those skilled in the art and which includes additional external circuitry that will not be described herein. The hold switch is controlled by the output of the IC circuit 29 and, when it is on, passes the voltage stored in the capacitor 36 to the oscillator 16 to control the frequency thereof. The circuits 29 and 30 are adjusted so that initially the loop switch 40 is on and the hold switch 41 is off. At some predetermined time later the loop switch 40 is turned off and simultaneously the hold switch 41 is turned on. In many applications, one single-pole double-throw switch might be utilized to perform this function, but in the present embodiment two switches are illustrated so that control of the oscillator 16 can be switched from the loop to the hold circuit and the switch 41 can then be pulsed or turned off at will without altering the loop switch 40. In the schematic illustrated, the IC circuit 27 is an SN7400 and the IC circuits 28, 29 and 30 are each an SN74123. The switching circuit 41 is an MC14016. An amplifier circuit 45 having an extremely high input impedence is connected between the capacitor 36 and the switch 41 to prevent degrading the charge on the capacitor 36 when the switch 41 is operated. In this embodiment the amplifier 45 is an LM210. All other components in the circuitry illustrated in FIG. 2 should be relatively obvious to one skilled in the art and will not be elaborated upon.

Thus, oscillator apparatus is disclosed which is adapted to lock on to a single pulse, or burst, of radio frequency waves and which is relatively fast. Further, the oscillator apparatus illustrated is relatively small, simple and inexpensive. These advantages are available because the control voltage is sampled and stored to control the oscillator after the pulse has ceased, as opposed to storing the input frequency or the like. Because the relatively low frequency control voltage is sampled and stored the circuitry can be simple and inexpensive IC circuits, as illustrated. While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

What is claimed is:

1. Oscillator apparatus adapted to lock onto a single pulse, or burst, of radio frequency waves comprising:
   (a) an apparatus input adapted to receive the single pulse, or burst, of radio frequency waves;
   (b) a variable oscillator having an output and a control input;
   (c) switch means having an output connected to the control input of said variable oscillator and having first, second and control inputs, said switch means operating to connect the first input to the output thereof in a first mode and the second input to the output thereof in a second mode;
   (d) a control loop connected to the control input of said variable oscillator through the first input of said switch means for providing a control signal to lock the output of said variable oscillator to the frequency of the radio frequency waves during the first mode of said switch means;
   (e) timing means coupled to the control input of said switch means and further coupled to said control loop through a low pass filter designed to pass substantially only the control signal and operating, upon the reception of a pulse of radio frequency waves at said apparatus input, to activate said switch means to the first mode and a predetermined time later activate said switch means to the second mode; and
   (f) sample and hold means coupled to said control loop and the second input of said switch means for sampling the control signals controlling said variable oscillator in the first mode, holding the sampled signals, and applying the sampled signals to the control input to control said variable oscillator when said switch means switches to the second mode.

2. Oscillator apparatus as claimed in claim 1 wherein the filter is connected to the timing means through a detector for providing an activating signal to said timing means.

3. Oscillator apparatus adapted to lock onto a single pulse, or burst, of radio frequency waves comprising:
   (a) an apparatus input adapted to receive the single pulse, or burst, of radio frequency waves;
   (b) a variable oscillator having an output and a control input;
   (c) switch means having an output connected to the control input of said variable oscillator and having first, second and control inputs, said switch means operating to connect the first input to the output thereof in a first mode and the second input to the output thereof in a second mode;

(d) a control loop connected to the control input of said variable oscillator through the first input of said switch means for providing a control signal to lock the output of said variable oscillator to the frequency of the radio frequency waves during the first mode of said switch means;

(e) timing means coupled to the control input of said switch means and operating, upon the reception of a pulse of radio frequency waves at said apparatus input, to activate said switch means to the first mode and a predetermined time later activate said switch means to the second mode;

(f) sample and hold means coupled to said control loop and the second input of said switch means for sampling the control signals controlling said variable oscillator in the first mode, holding the sample signals, and applying the sampled signals to the control input to control said variable oscillator when said switch means switches to the second mode; and (g) detector means connected to the apparatus input and to the variable oscillator for turning said variable oscillator on when a pulse of radio frequency waves is detected.

* * * * *